(12) United States Patent
Wang et al.

(10) Patent No.: US 8,304,179 B2
(45) Date of Patent: Nov. 6, 2012

(54) METHOD FOR MANUFACTURING A SEMICONDUCTOR DEVICE USING A MODIFIED PHOTOSENSITIVE LAYER

(75) Inventors: Chien-Wei Wang, Wufong Township (TW); Ching-Yu Chang, Yuansun Village (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 457 days.

(21) Appl. No.: 12/463,501

(22) Filed: May 11, 2009

(65) Prior Publication Data

US 2010/0285410 A1 Nov. 11, 2010

(51) Int. Cl.
*G03F 7/26* (2006.01)

(52) U.S. Cl. .................... 430/324; 430/330

(58) Field of Classification Search ............ 430/330, 430/314, 324, 325, 331, 329, 313
See application file for complete search history.

(56) References Cited

U.S. PATENT DOCUMENTS

| | | | |
|---|---|---|---|
| 5,326,672 A | 7/1994 | Tanaka et al. | |
| 5,374,502 A | 12/1994 | Tanaka et al. | |
| 5,759,614 A | 6/1998 | Tomoeda et al. | |
| 6,024,887 A | 2/2000 | Kuo et al. | |
| 6,077,966 A | 6/2000 | Matsumura et al. | |
| 6,159,662 A | 12/2000 | Chen et al. | |
| 6,372,651 B1 | 4/2002 | Yang et al. | |
| 6,416,933 B1 * | 7/2002 | Singh et al. | 430/313 |
| 6,428,852 B1 | 8/2002 | Pillion et al. | |
| 6,509,141 B2 | 1/2003 | Mullee | |
| 6,556,280 B1 | 4/2003 | Kelsey et al. | |
| 6,565,764 B2 | 5/2003 | Hiraoka et al. | |
| 6,566,280 B1 | 5/2003 | Meagley et al. | |
| 6,656,666 B2 | 12/2003 | Simons et al. | |
| 6,660,459 B2 | 12/2003 | Babcock | |
| 6,713,236 B2 | 3/2004 | Chen | |
| 6,781,670 B2 | 8/2004 | Krautschik | |
| 6,788,477 B2 | 9/2004 | Lin | |
| 7,959,818 B2 | 6/2011 | Jung | |
| 2003/0216269 A1 | 11/2003 | DeYoung et al. | |
| 2004/0029396 A1 | 2/2004 | Zhang et al. | |
| 2004/0185382 A1 * | 9/2004 | Byun et al. | 430/313 |

(Continued)

FOREIGN PATENT DOCUMENTS

CN 1089369 7/1994

(Continued)

OTHER PUBLICATIONS

Ko Noguchi et al., "Plasma-Induced Gate Oxide Degradation and It's Impact on Oxide Reliability for CMOS FETs", 0-8194-1667-3/94/ $6.00, SPIE vol. 224 / 203-213.

(Continued)

*Primary Examiner* — Cynthia Kelly
*Assistant Examiner* — Caleen Sullivan
(74) *Attorney, Agent, or Firm* — Haynes and Boone, LLP

(57) ABSTRACT

The present disclosure provides a method for manufacturing a semiconductor device. The method includes coating a photoresist on a substrate. The photoresist is exposed to radiation. The radiation exposed photoresist is baked. The radiation exposed and baked photoresist is developed to create an image pattern. The image pattern is treated with a treating material. An ion implantation process is performed to the substrate and the treated image pattern. The image pattern is stripped from the substrate. A carbon atom ratio of the treating material is less than a carbon atom ratio of the photoresist.

17 Claims, 14 Drawing Sheets

U.S. PATENT DOCUMENTS

| | | | |
|---|---|---|---|
| 2004/0219451 A1 | 11/2004 | Arao et al. | |
| 2004/0265747 A1 | 12/2004 | Medeiros et al. | |
| 2005/0153466 A1 | 7/2005 | Choi et al. | |
| 2005/0164133 A1 | 7/2005 | Rangarajan et al. | |
| 2006/0003271 A1 | 1/2006 | Clark et al. | |
| 2006/0124586 A1 | 6/2006 | Kobayashi et al. | |
| 2006/0134547 A1 | 6/2006 | Huang et al. | |
| 2007/0009830 A1 | 1/2007 | Huang et al. | |
| 2007/0037410 A1 | 2/2007 | Chang et al. | |
| 2007/0243773 A1 | 10/2007 | Phenis et al. | |
| 2007/0248916 A1* | 10/2007 | Kamijima | 430/315 |
| 2008/0032508 A1 | 2/2008 | Chang | |
| 2008/0076060 A1 | 3/2008 | Fedynyshyn | |
| 2008/0193876 A1 | 8/2008 | Sawada et al. | |
| 2008/0199814 A1 | 8/2008 | Brzozowy et al. | |
| 2008/0280230 A1* | 11/2008 | Chang et al. | 430/312 |
| 2009/0011374 A1 | 1/2009 | Chang et al. | |
| 2009/0087786 A1 | 4/2009 | Hatakeyama | |
| 2009/0148789 A1 | 6/2009 | Amara et al. | |
| 2010/0009132 A1 | 1/2010 | Cheng et al. | |
| 2010/0040838 A1 | 2/2010 | Abdallah et al. | |
| 2010/0151209 A1 | 6/2010 | Wei et al. | |
| 2010/0273321 A1 | 10/2010 | Wang et al. | |
| 2011/0008968 A1 | 1/2011 | Chang | |

FOREIGN PATENT DOCUMENTS

| | | |
|---|---|---|
| CN | 1457504 | 11/2003 |
| CN | 1531745 | 9/2004 |
| JP | 2010824 | 1/1990 |
| WO | WO 2004/051379 | 6/2004 |
| WO | WO 2006/025303 | 3/2006 |

OTHER PUBLICATIONS

Francis Houlihan et al., "Second Generation Radiation Sensitive Developable Bottom Anti Reflective Coatings (DBARC) and Implant Resists Approaches for 193nm Lithography", Advances in Resist Materials and Processing Technology XXIV, edited by Qinghuang Lin Proc. of SPIE vol. 6519, 65190L, (2007), 8 pages.

Seokbin Yu et al., "Residue Formation in the Removal of Ion Implanted Photoresist", Journal of the Korean Physical Socity, vol. 33, No. , Nov. 1998, pp. S80-S83.

Chinese Patent Office, Office Action dated Aug. 25, 2011, Application No. 200910225445.9, 8 pages.

Chinese Office Action dated May 8, 2009; Chinese Application No. 2008100007503; 5 Pages.

Edward Bok, Dieter Kelch and Kevin S. Schumacher; "Supercritical Fluids for Single Wafer Cleaning;" Jun. 1992; Solid State Technology; pp. 117-120.

Eric Hayduk and Christopher Ober; "Characterization of Supercritical $CO_2$ Developable Photoresists for Non-Wetting Surfaces;" 1998; The National Nanofabrication Users Network Research Experience for Undergraduates; Research Accomplishments; Cornell Nanofabrication Facility; National Nanofabrication Users Networks; pp. 10-12.

Xiaogang Zhang, Joseph Q. Pham, Nick Ryza, Peter F. Green and Keith P. Johnston; "Chemical-Mechanical Photoresist Drying in Supercritical Carbon Dioxide With Hydrocarbon Surfactants;" Mar./Apr. 2004; J. Vac. Sci. Technol. B 22(2); pp. 818-825.

Jasper, J.J.; "Surface Tension of Common Liquids;" Phys. Chem. Ref. Data; 1; 841; 1972; pp. 6-135-6-138.

* cited by examiner

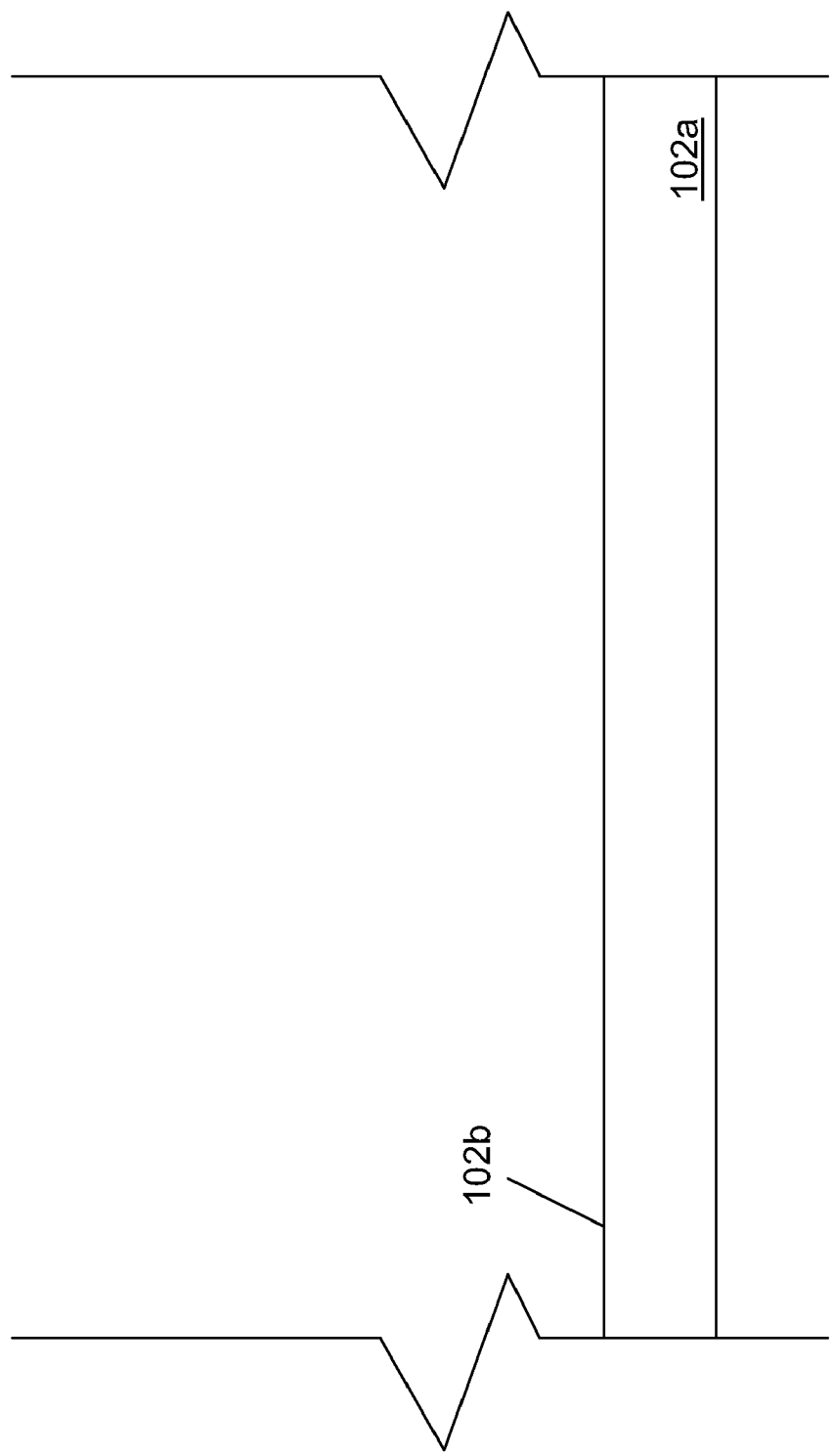

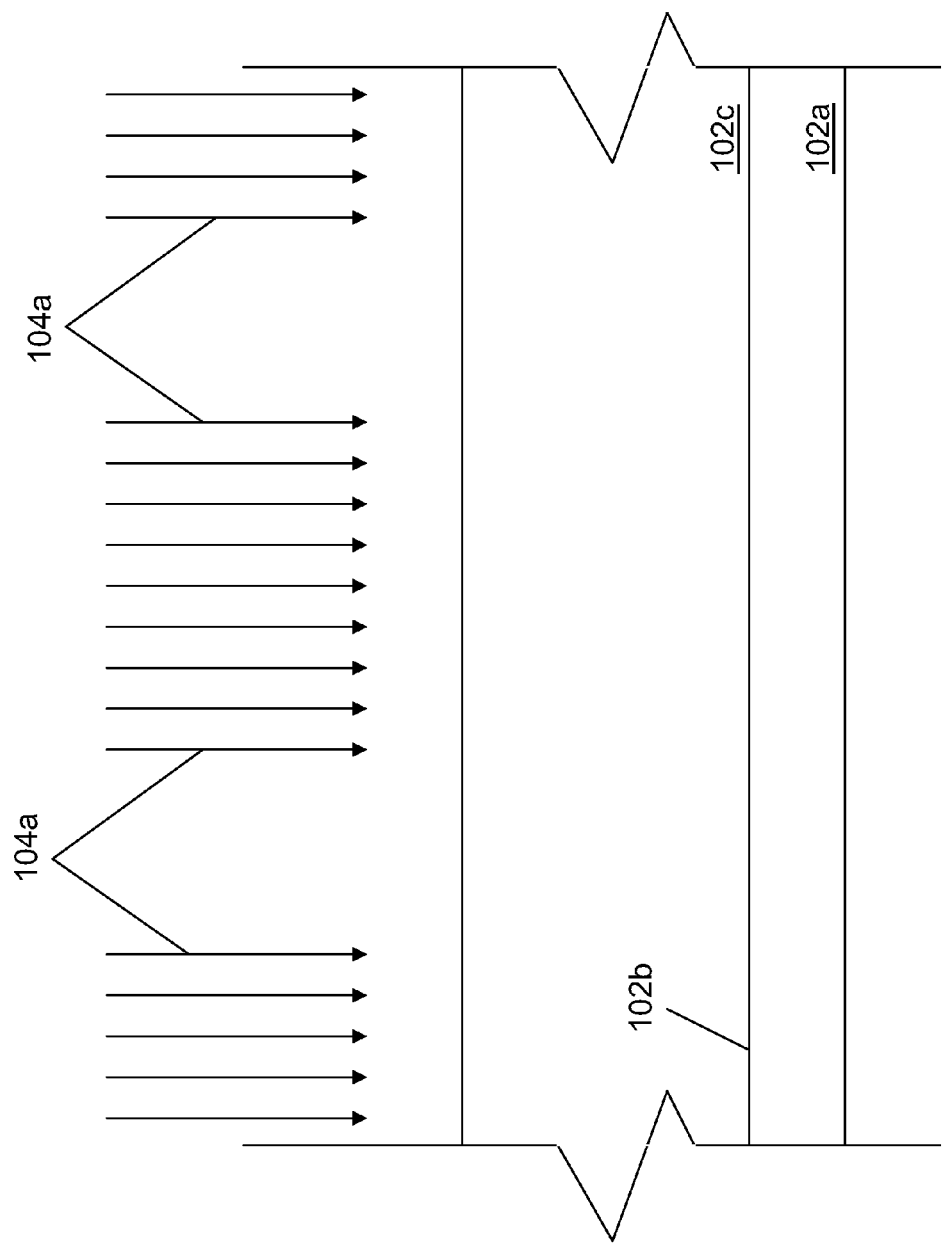

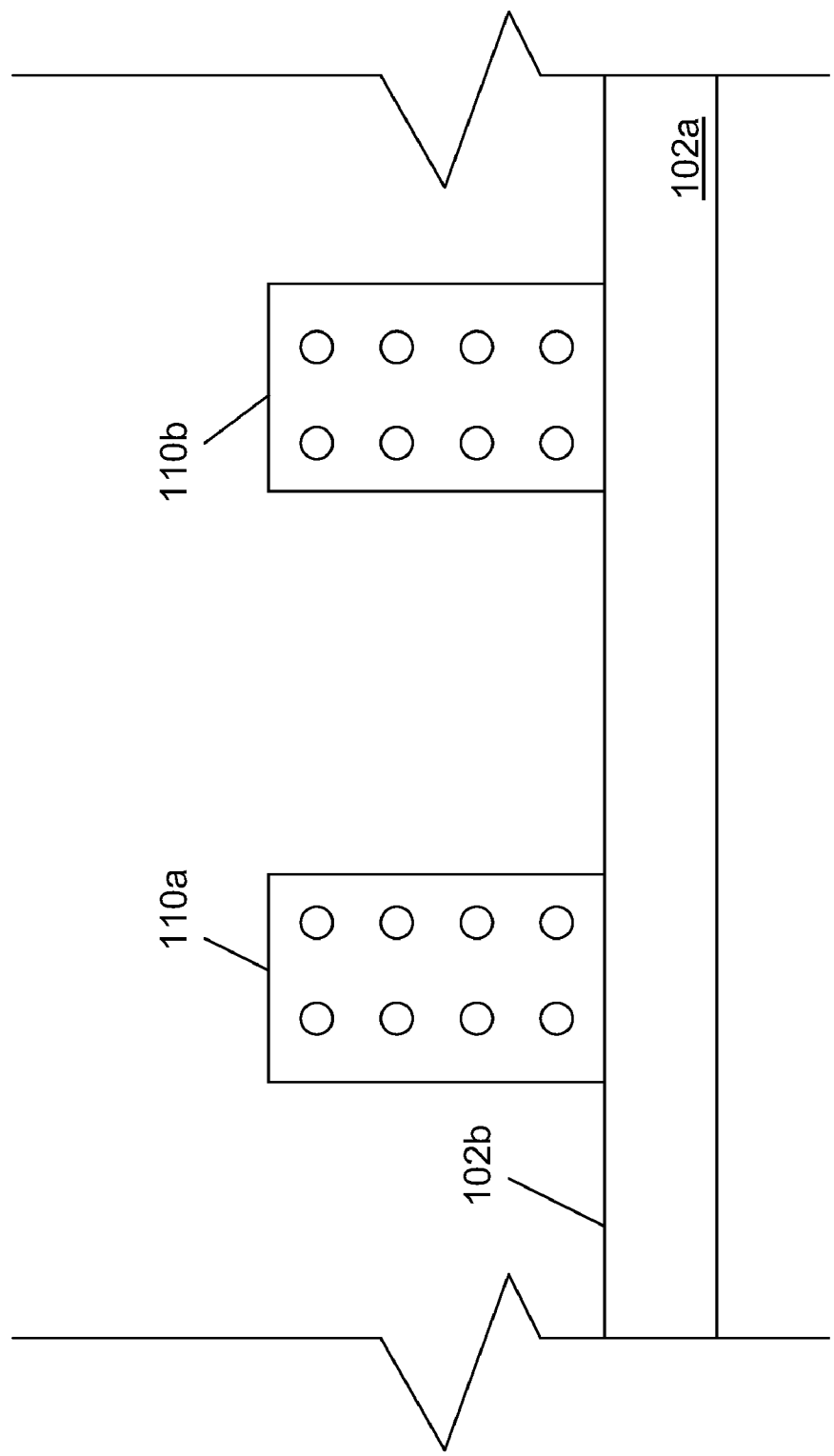

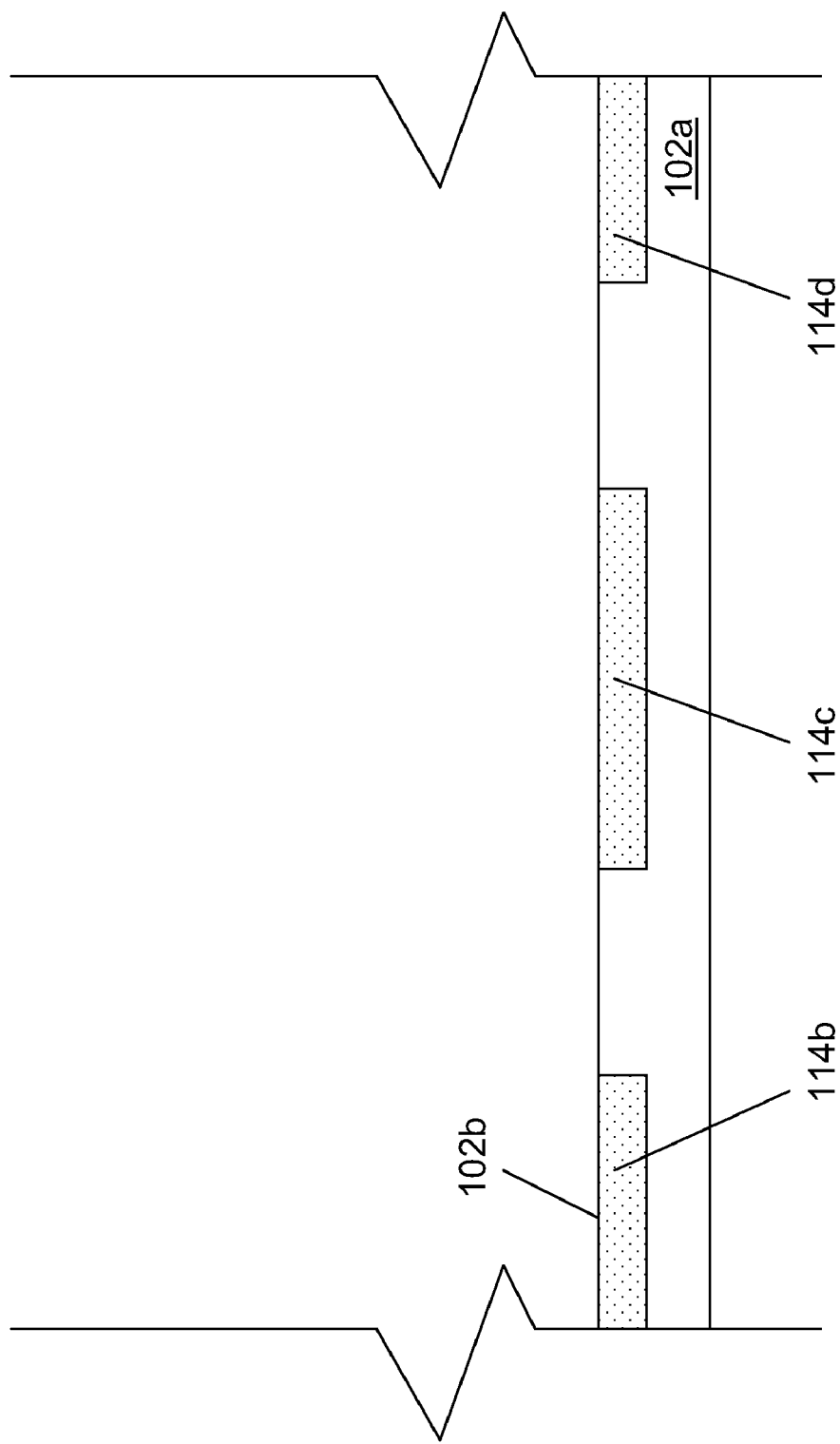

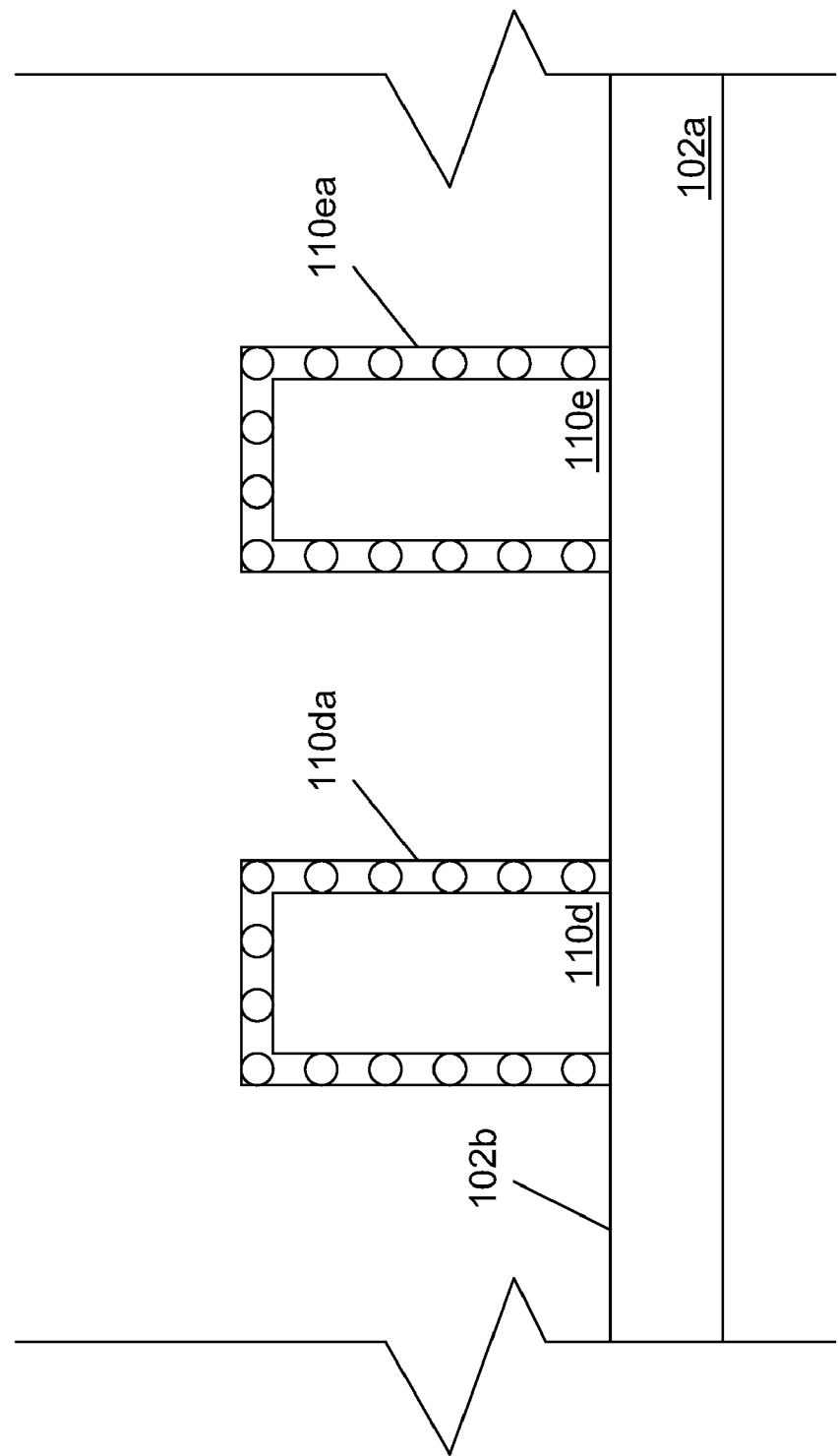

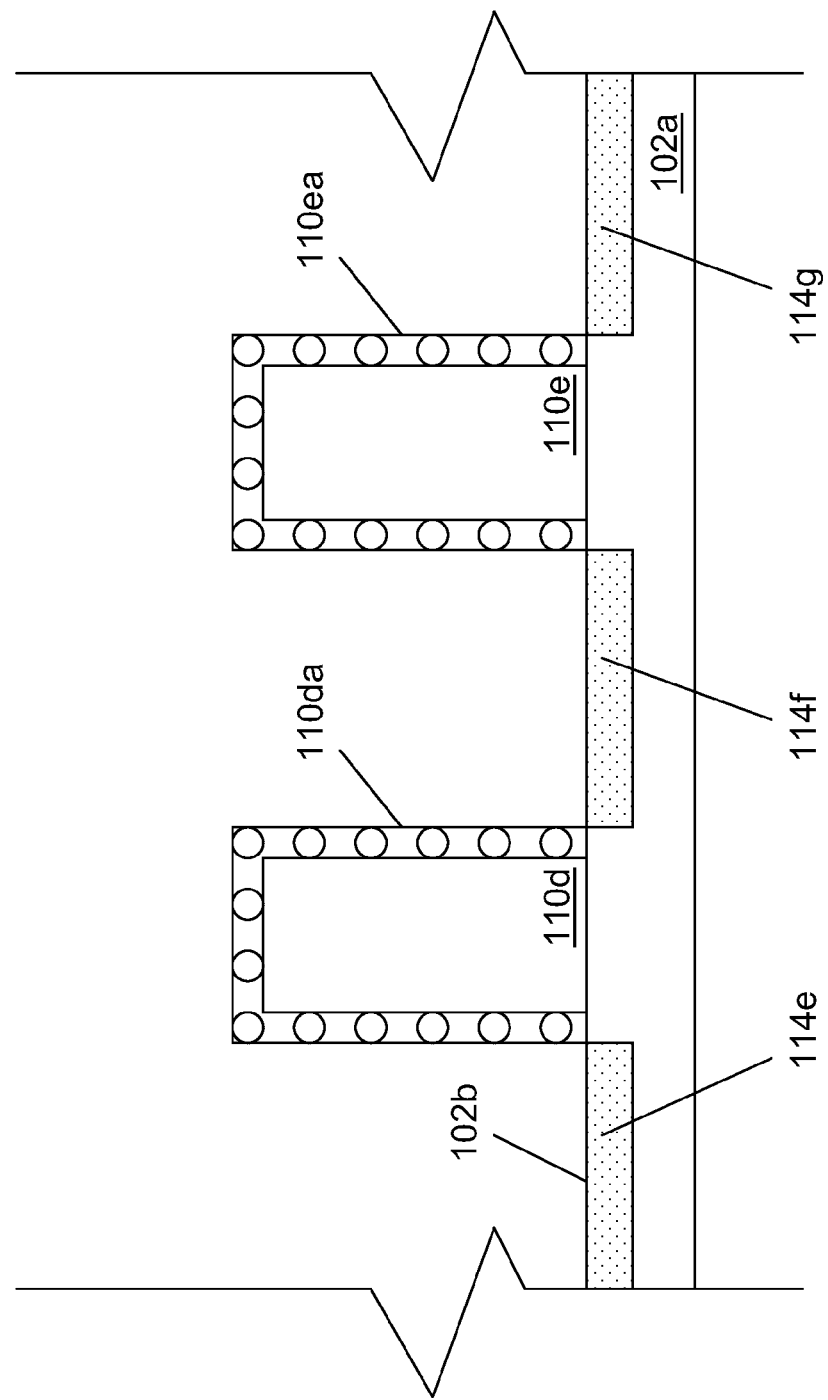

METHOD FOR MANUFACTURING A SEMICONDUCTOR DEVICE USING A MODIFIED PHOTOSENSITIVE LAYER

BACKGROUND

The present disclosure relates generally to semiconductor manufacturing processes and in particular to a method for manufacturing a semiconductor device using a modified photoresist in the semiconductor manufacturing process.

Conventional photoresists tend to form a carbon 'crust' on their surface in response to being exposed to an ion implantation step in the integrated circuit manufacturing process. Removing this carbon-crusted photoresist can raise a number of issues. There are two methods for removing the photoresist from the substrate after it has been exposed to the ion implantation step. One method for removing the photoresist from the substrate involves both dry etching followed by wet etching. The dry etching step tends to remove the carbon crust that has formed on the photoresist, while the wet etching step removes any of the photoresist not removed during the dry etching. However, dry etching may require using a plasma (e.g., $O_3$, $CF_4$, etc.) that can damage the ion implanted substrate due to, for example, oxide loss, and result in a reduced electrical performance and yield. A solution to this problem involves wet etching without the substrate-damaging dry etch. Such a method can prevent the substrate damage discussed above, but typically suffers from the failure of the wet etching to remove all of the carbon crust that formed on the photoresist during the ion implantation process. This left-over carbon crust can remain on the substrate and influence electrical performance and/or cause defects in the semiconductor device.

SUMMARY

One of the broader forms of an embodiment of the invention involves a method for fabricating a semiconductor device. The method includes coating a photoresist on a substrate; exposing the photoresist to radiation; baking the radiation exposed photoresist; developing the radiation exposed and baked photoresist to create an image pattern; treating the image pattern with a treating material; performing an ion implantation process to the substrate and the treated image pattern; and stripping the image pattern from the substrate. A carbon atom ratio of the treating material is less than a carbon atom ratio of the photoresist.

Another one of the broader forms of an embodiment of the invention involves a method for fabricating a semiconductor device. The method includes coating a photoresist on a substrate; patterning the photoresist to form an image pattern; treating the image pattern such that the treated image pattern has a higher non-carbon atom ratio than the photoresist; performing an ion implantation process to the substrate and the treated image pattern; and stripping the image pattern from the substrate.

Yet another one of the broader forms of an embodiment of the invention involves a method for fabricating a semiconductor device. The method includes coating a photosensitive layer on a substrate; patterning the photosensitive layer to form an image pattern; treating the image pattern with a chemical having a carbon atom ratio that is less than 50%, the chemical being incorporated to an outer portion of the image pattern; performing an ion implantation process to the substrate and the treated image pattern; and stripping the image pattern from the substrate.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIG. 1b is a schematic view illustrating an embodiment of a substrate;

FIG. 1d is a schematic view illustrating an embodiment of the layer of image photoresist of FIG. 1c being exposed to radiation;

FIG. 1h is a schematic view illustrating an embodiment of a plurality of modified image pattern members on the substrate of FIG. 1b;

FIG. 1k is a schematic view illustrating an embodiment of the substrate and ion-implanted sections of FIG. 1j with the modified image pattern members of FIG. 1h stripped from the substrate;

FIG. 2a is a schematic view illustrating an embodiment of the treating material of FIG. 1f bonded to the surface of the image pattern members of FIG. 1e;

FIG. 2c is a schematic view illustrating an embodiment of a plurality of ion-implanted sections created on the substrate of FIG. 1b between the modified image pattern members of FIG. 2b.

DETAILED DESCRIPTION

Figure 1A:
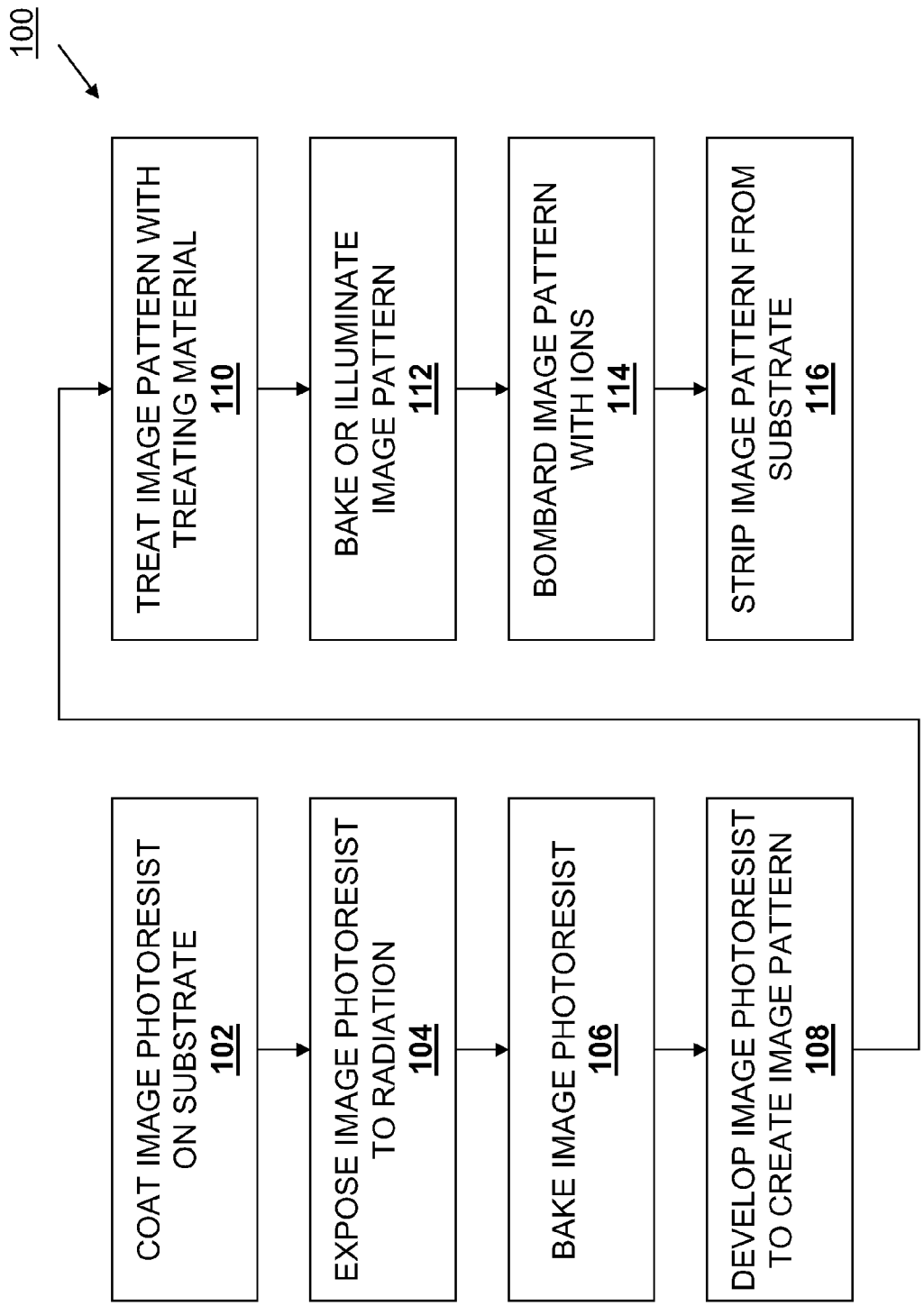
FIG. 1a is a flow chart illustrating an embodiment of a method of manufacturing a semiconductor device using a modified photoresist.

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

Figure 1C:
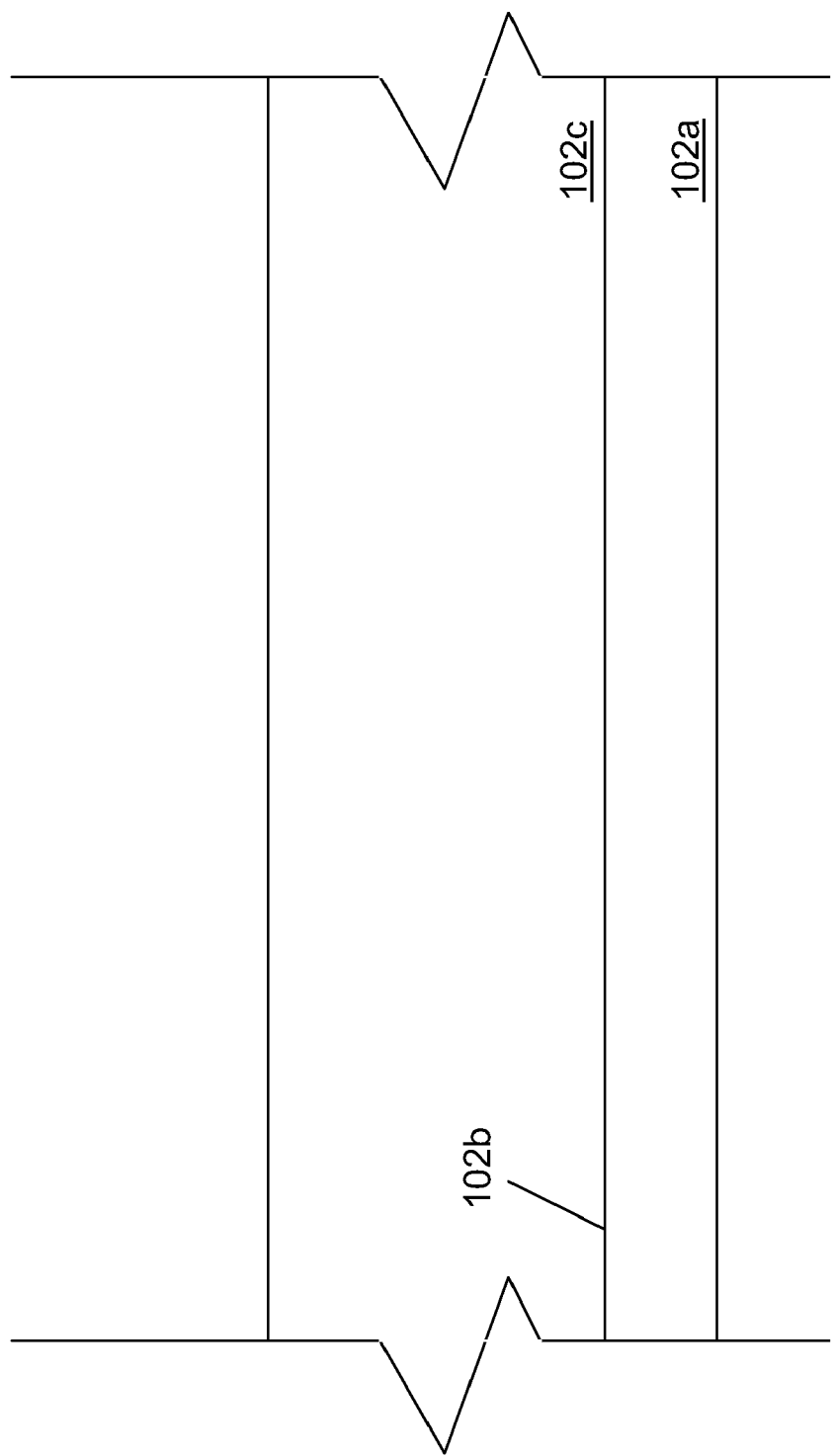
FIG. 1c is a schematic view illustrating an embodiment of a layer of image photoresist coated on the substrate of FIG. 1b.

Referring now to FIGS. 1a, 1b, 1c, 1d, and 1e, a method 100 for manufacturing a semiconductor device using a modified photoresist is illustrated. The method 100 begins at block 102 where an image photoresist is coated on a semiconductor substrate. In an embodiment, a substrate 102a having a top surface 102b, illustrated in FIG. 1b, is provided. A layer of image photoresist 102c is coated on the top surface 102b of the substrate 102a, as illustrated in FIG. 1c. In an embodiment, the image photoresist 102c is an organic image photoresist. In an embodiment, the image photoresist 102c includes at least a photo acid generator (PAG), a quencher, a surfactant, and an acid cleavable molecule with a C—C linked backbone. The method 100 then proceeds to block 104 where the image photoresist is exposed to radiation. The image photoresist 102c may be exposed to a radiation pattern 104a, as illustrated in FIG. 1d. In an embodiment, the PAG in the image photoresist 102c releases an acid in response to exposure to the radiation pattern 104a. The method 100 then proceeds to block 106 where the image photoresist is baked. A post-exposure bake (PEB) may be performed to allow the exposed photoresist polymers to cleave. In an embodiment, the PEB causes the image photoresist 102c to release its acid leaving group so that the solubility of the image photoresist 102c in an aqueous developer solution is increased.

Figure 1E:
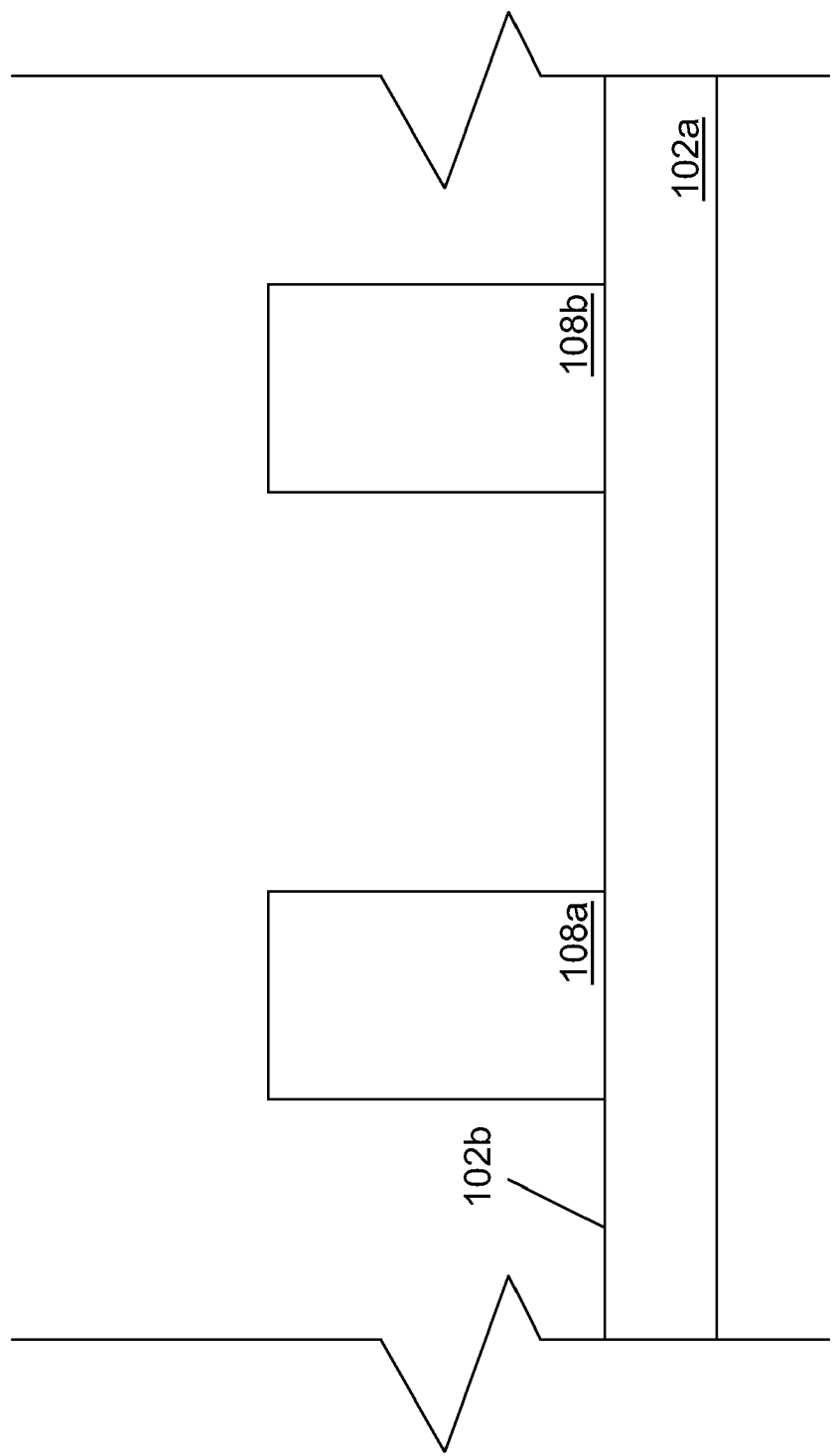
FIG. 1e is a schematic view illustrating an embodiment of a plurality of image pattern members created on the substrate of FIG. 1b.

The method 100 then proceeds to block 108 where the image photoresist is developed to create an image pattern. The substrate 102a including the cleaved polymer photoresist may be transferred to a developing chamber in order to apply an aqueous developer solution (in which the cleaved polymer photoresist is soluable) in order to remove the exposed photoresist and produce an image pattern having a plurality of image pattern members 108a and 108b extending from the top surface 102b of the substrate 102a, as illustrated in FIG. 1e. In an embodiment, a developer solution such as tetramethyl ammonium hydroxide (TMAH) is applied to the image photoresist surface in the form of a puddle to develop the exposed image photoresist, a de-ionized water rinse is then applied to the substrate to remove the dissolved polymers of the photoresist, and the substrate is then sent to a spin dry process in order to create the image pattern members.

Figure 1F:
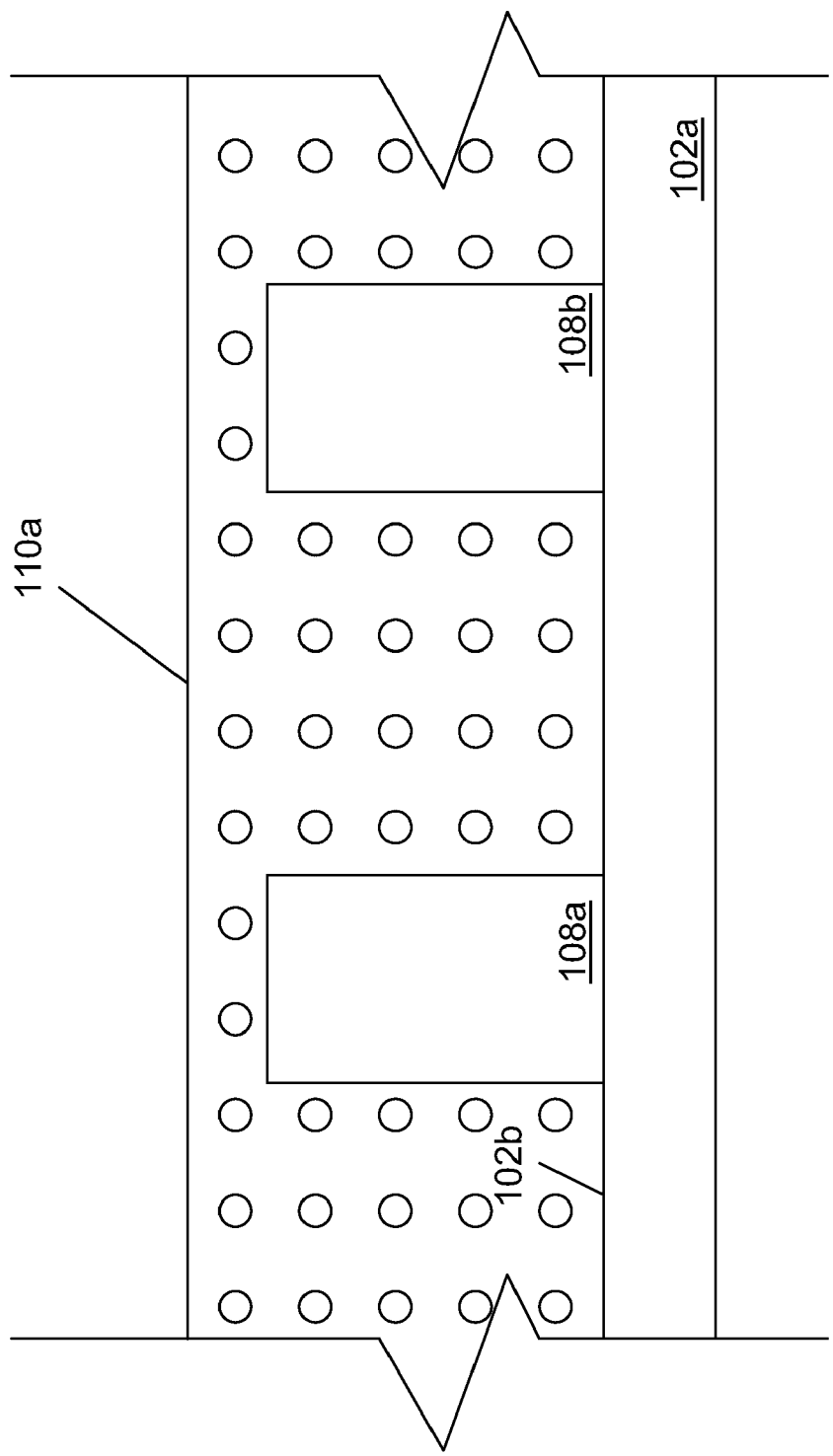
FIG. 1f is a schematic view illustrating an embodiment of a treating material applied to the image pattern members of FIG. 1e.

Referring now to FIGS. 1a, 1f, 1g, and 1h, the method 100 then proceeds to block 110 where the image pattern is treated with a treating material. In an embodiment, a treating material 110a is applied to the top surface 102b of the substrate 102a and the image pattern members 108a, as illustrated in FIG. 1f. In an embodiment, a carbon atom ratio of the treating material 110a is less than the carbon atom ratio of the image photoresist 102c. In an embodiment, the carbon atom ratio of the treating material 110a is less than 50%. In an embodiment, the carbon atom ratio of the treating material 110a is less than 20%. In an embodiment, the treating material 110a includes non-carbon atoms that include at least one of nitrogen, oxygen, phosphorus, sulfur, silicon, hydrogen, and boron.

In an embodiment, the treating material 110a includes C—C backbone with the formula:

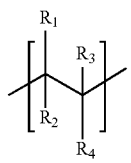

In an embodiment, the molecular weight of the treating material 110a is between 500 and 20,000. In an embodiment, $R_1$, $R_2$, $R_3$, and $R_4$ are each hydrogen, a hydroxyl group, a fluorine atom, and/or a straight, branched, cyclic, or fluorinated alkyl or alkoxyl group. In an embodiment, $R_1$, $R_2$, $R_3$, and $R_4$ may further include an amine, an amido, an aminol, an epoxy, a SiO, an alcohol, a halogen, a thio, an ester, and a carboxylic group.

In an embodiment, the treating material 110a includes C—O backbone with the formula:

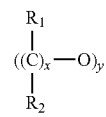

In an embodiment, the molecular weight of the treating material 110a is between 500 and 20,000, x is between 1 and 6, and y is between 20 and 100. In an embodiment, x is either 1, 2, or 3, and y is between 20 and 60. In an embodiment, $R_1$ and $R_2$ are each hydrogen, a hydroxyl group, a fluorine atom, or a straight, branched, cyclic, or fluorinated alkyl or alkoxyl group. In an embodiment, $R_1$ and $R_2$ may further include an amine, an amido, an aminol, an epoxy, a SiO, an alcohol, a halogen, a thio, an ester, and a carboxylic group.

In an embodiment, the treating material 110a includes Si—O backbone with the formula:

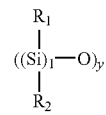

In an embodiment, the molecular weight of the treating material 110a is between 500 and 20,000, and y is between 10 and 100. In an embodiment, y is between 20 and 40. In an embodiment, $R_1$ and $R_2$ are each hydrogen, a hydroxyl group, a fluorine atom, or a straight, branched, cyclic, or fluorinated alkyl or alkoxyl group. In an embodiment, $R_1$ and $R_2$ may further include an amine, an amido, an aminol, an epoxy, a SiO, an alcohol, a halogen, a thio, an ester, and a carboxylic group.

Figure 1G:
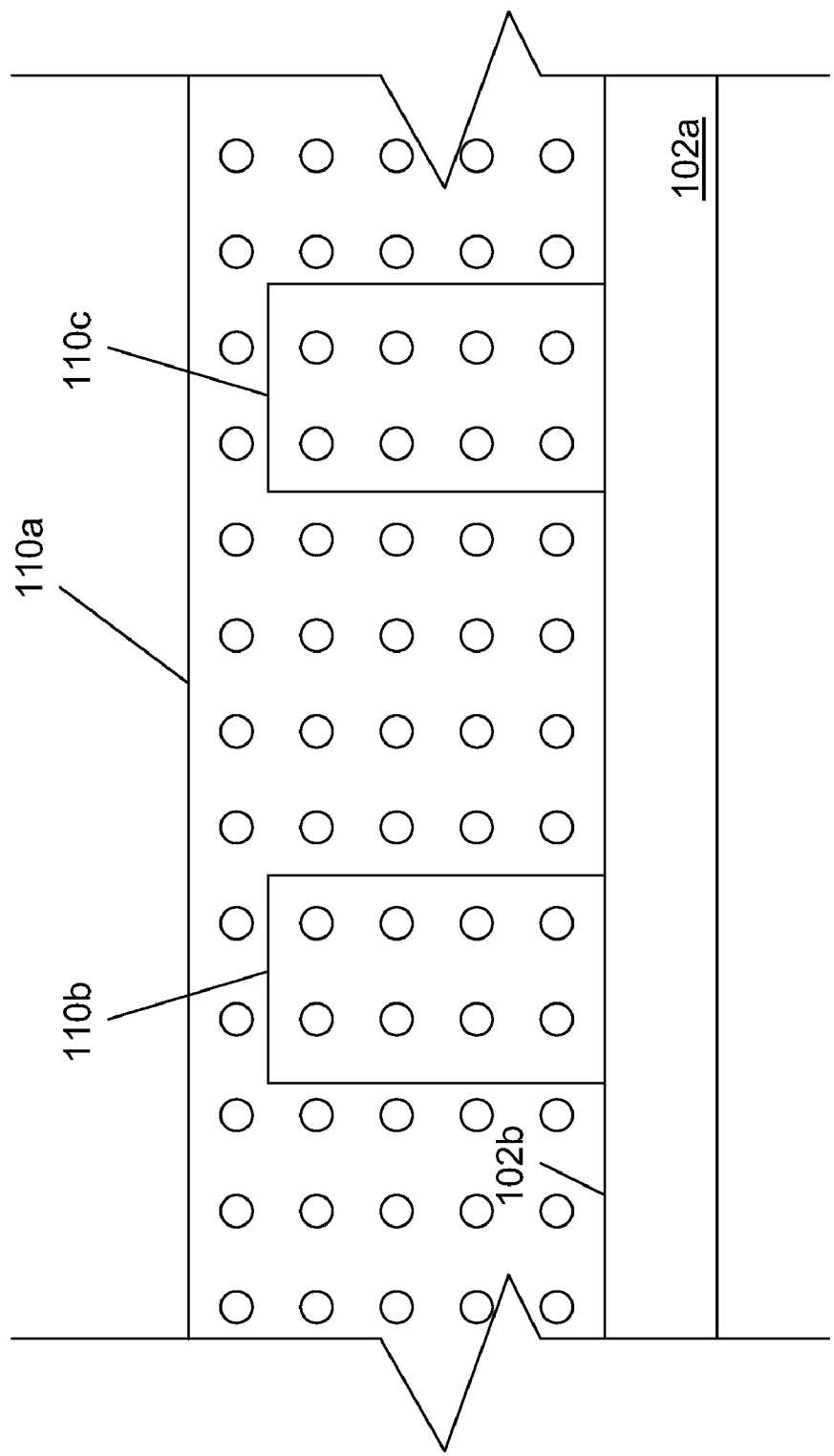
FIG. 1g is a schematic view illustrating an embodiment of the treating material of FIG. 1f diffused into the image pattern members of FIG. 1e.

In an embodiment, the treating material 110a is heated to a temperature ranging from about 10 to about 80° C. In an embodiment, the treating material 110a is heated to a temperature ranging from about 10 to about 130° C. In an embodiments, heating the treatment material 110a may be performed prior to applying it to the image pattern members 108a and 108b. In an embodiment, heating the treatment material 110a may be performed after applying it to the image pattern members 108a and 108b. In an embodiment, heating the treatment material 110a may be performed prior to and after applying it to the image pattern members 108a and 108b. The heating may help in effectively diffusing the treating material into the image pattern members 108a and 108b. In an embodiment, the treating material 110a will diffuse into the image pattern members 108a and 108b and the excess treating material 110a will be rinsed away from the substrate 102a to create modified image pattern members 110b and 110c, as illustrated in FIGS. 1g and 1h. In an embodiment, the modified image pattern members 110b and 110c include a higher non-carbon atom ratio than the image photoresist 102c (FIG. 1d). In an embodiment, the non-carbon atom ratio of the modified image pattern members 110b and 110c is greater than 50%. In an embodiment, the non-carbon atom ratio of the modified image pattern members 110b and 110c is greater than 80%. The method 100 then proceeds to block 112 where the modified image pattern members 110b and 110c are baked or illuminated using electromagnetic waves.

Figure 1I:
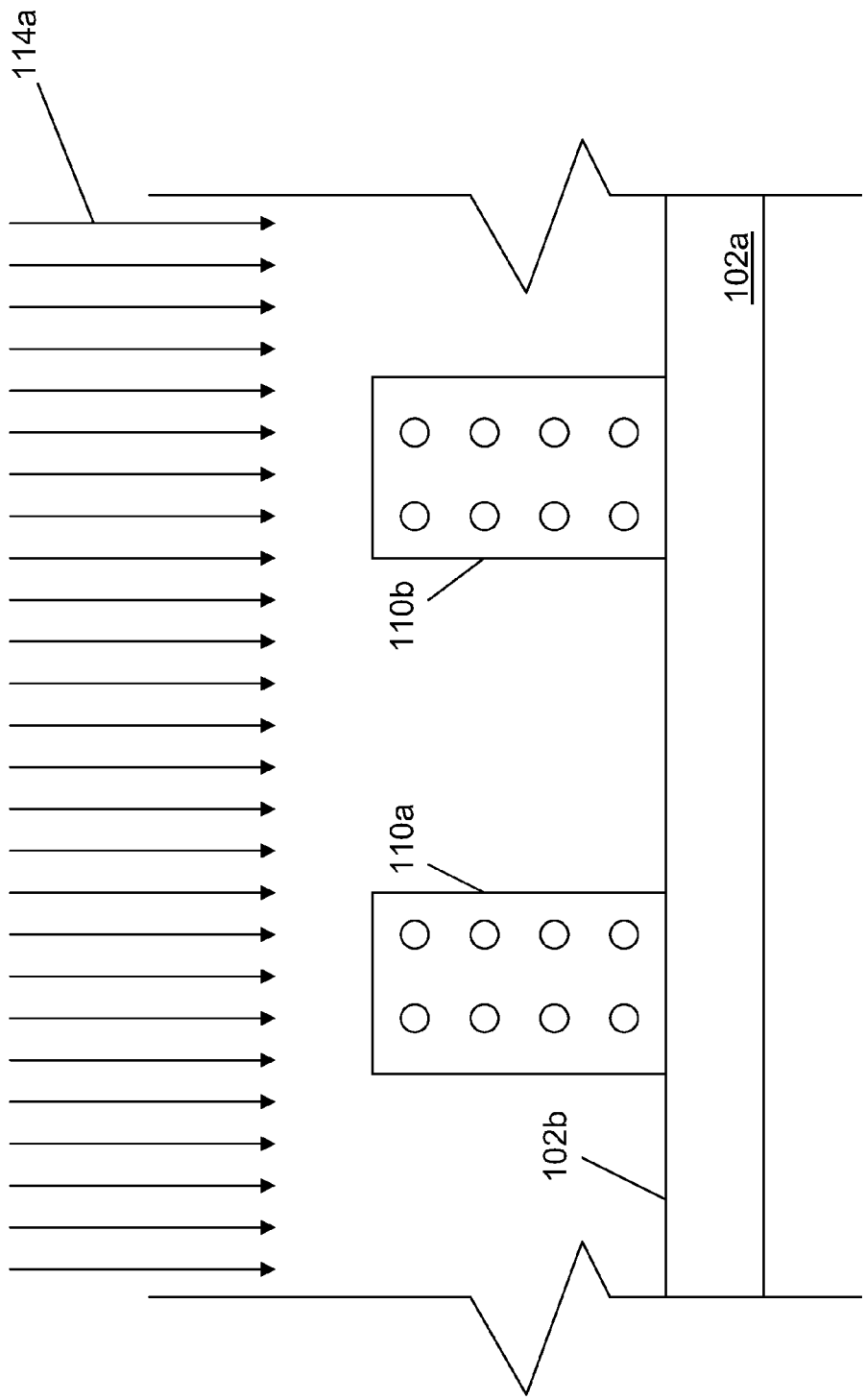
FIG. 1i is a schematic view illustrating an embodiment of the modified image pattern members of FIG. 1h being bombarded with ions.
Figure 1J:
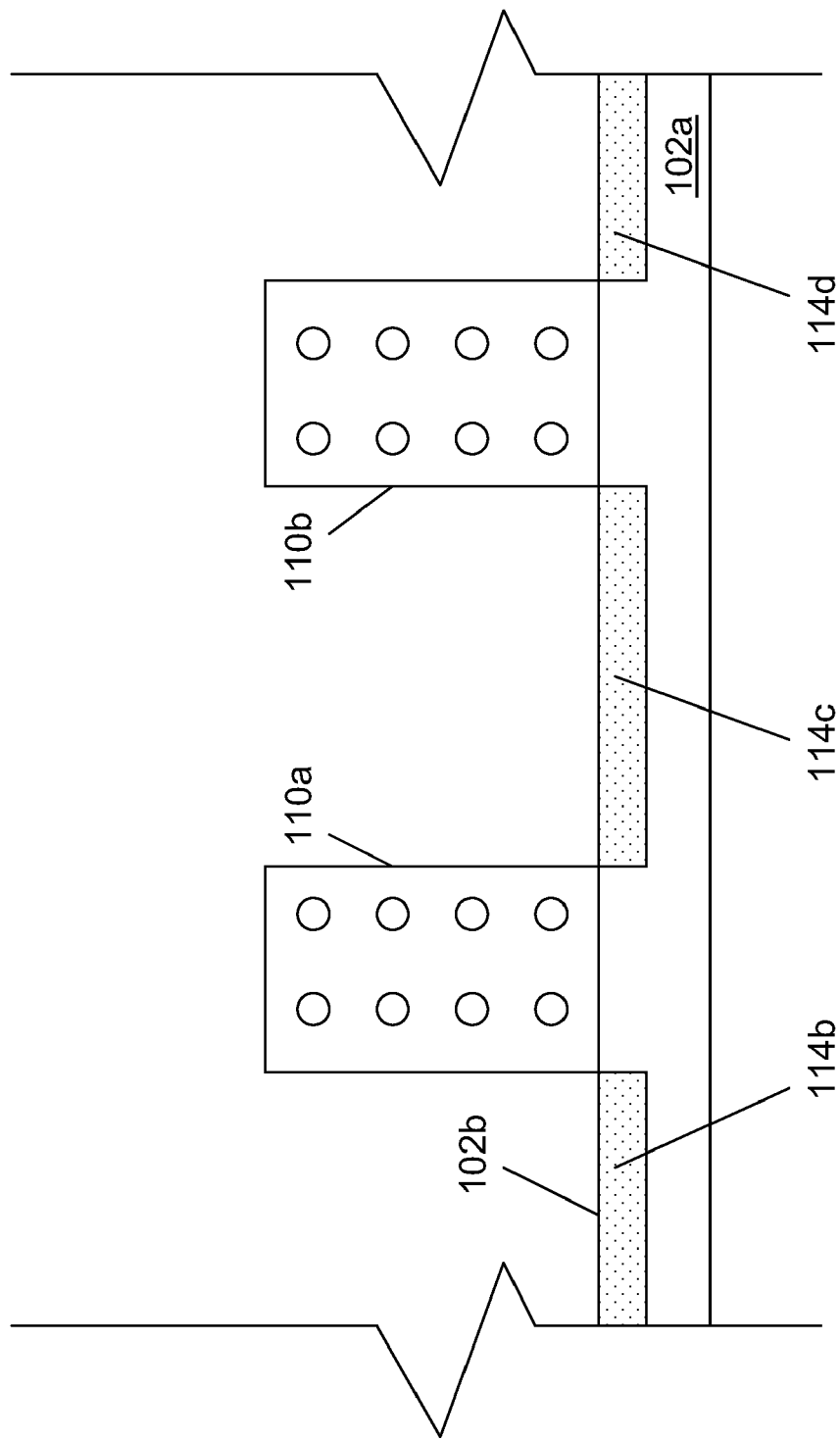
FIG. 1j is a schematic view illustrating an embodiment of a plurality of ion-implanted sections created on the substrate of FIG. 1b between the modified image pattern members of FIG. 1h.

Referring now to FIGS. 1a, 1i, and 1j, the method 100 then proceeds to block 114 where the substrate and the modified image pattern members are bombarded with ions in order to implant those ions in the substrate. The substrate 102a and the modified image pattern members 110a and 110b are bombarded with ions 114a that include at least one of arsenic atoms, phosphorus atoms, boron atoms, nitrogen atoms, carbon atoms, and germanium atoms, and those ions create ion-implanted sections 114b, 114c, and 114d in the substrate 102a.

Referring now to FIGS. 1a and 1k, the method 100 then proceeds to block 116 where the image pattern is stripped from the substrate. A wet strip may be conducted using a plasma or a fluid that is applied to remove the image pattern members 110a and 110b from the substrate 102a, as illustrated in FIG. 1k. In an embodiment, a plasma including at least one of $O_2$, $H_2$, $CF_4$, $Cl_2$, and HBr is used to wet strip the image pattern members 110a and 110b from the substrate 102a. In an embodiment, a fluid having a solvent that includes NMP, PGME, PGMEA, $H_2O$, and/or DMSO is used to wet strip the image pattern members 110a and 110b from the substrate 102a. In an embodiment, a fluid including at least water or an organic solvent and also an acid, a base, an oxidant, a reductant, and/or a surfactant, is used to wet strip the image pattern members 110a and 110b from the substrate 102a. In an embodiment, the acid in the fluid may include HCl, $H_2SO_4$, $HNO_3$, HF, or phosphoric acid. In an embodiment, the base in the fluid may include ammonia or TMAH. In an embodiment, the oxidant in the fluid may include $H_2O_2$, $HNO_3$, or $O_3$. In experimental embodiments, it has been found that allowing the treating material having a relatively low carbon ratio relative to the image photoresist to diffuse into the image pattern reduces the carbonizing phenomenon (i.e., the carbon 'crust') that occurs on the surface of the image pattern in response to ion bombardment, such that a wet etch/strip process that will not damage the ion-implanted sections on the substrate may be used to remove the image pattern without leaving any material (e.g., the carbon 'crust') on the substrate that could cause defects in the semiconductor device being manufactured.

Figure 2B:
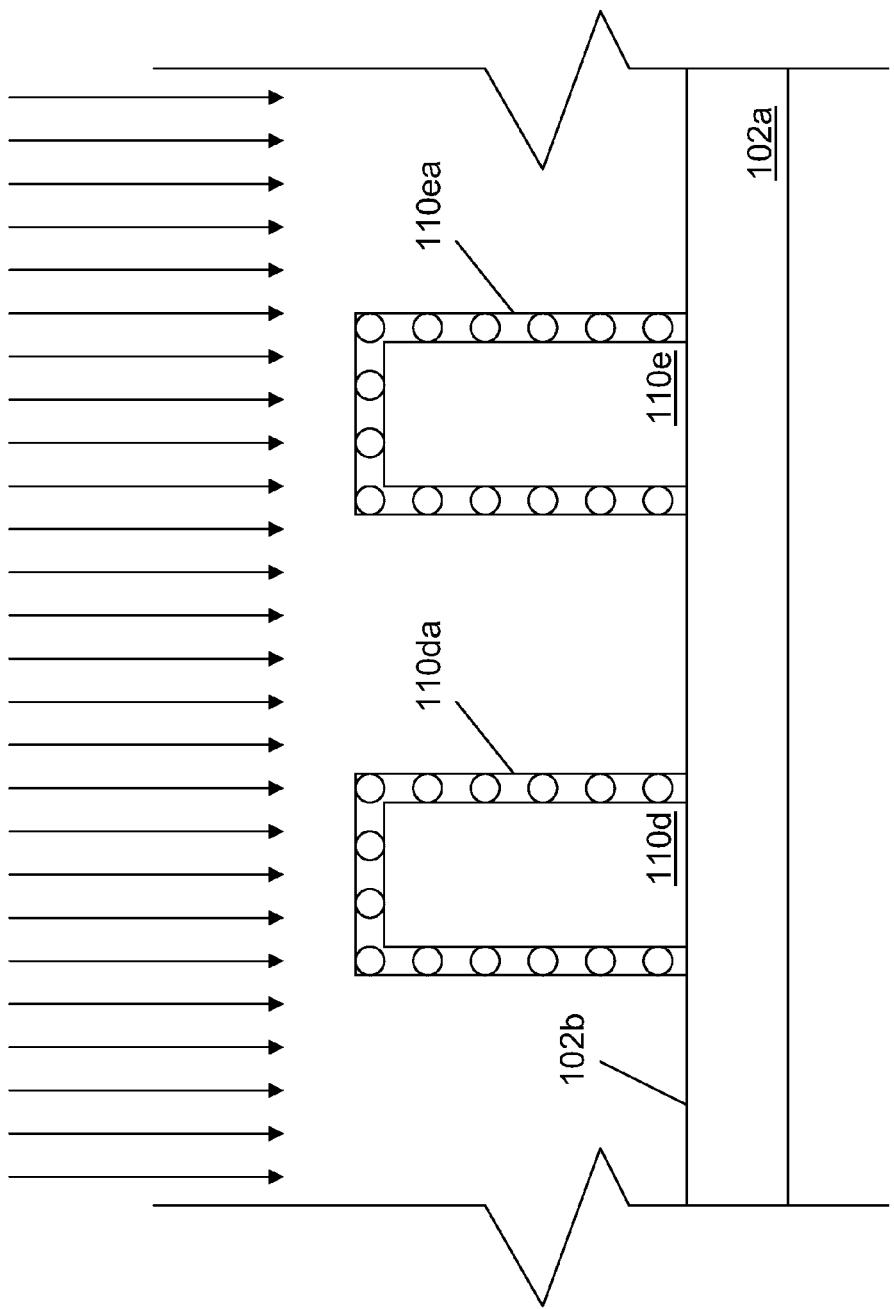
FIG. 2b is a schematic view illustrating an embodiment of the modified image pattern members being bombarded with ions.

Referring now to FIGS. 2a, 2b, and 2c, block 110 of the method 100 may be modified without departing from the scope of the present disclosure. Following blocks 102, 104, 106, and 108, the image pattern members 108a and 108b are created, as illustrated in FIG. 1e. The treating material 110a is then applied to the top surface 102b of the substrate 102a and the image pattern members 108a, as illustrated in FIG. 1f. However, instead of the treating material 110a diffusing into the image pattern members 108a and 108b and the excess treating material 110a being rinsed away from the substrate 102a to create modified image pattern members 110b and 110c, as described above with reference to FIGS. 1g and 1h, a chemical bonding occurs between the treating material 110a and the image pattern members 108a and 108b to bond the treating material 110a to the surface of the image pattern members 108a and 108b to create modified image pattern members 110d and 110e having a protective layer 110da and 110ea, as illustrated in FIG. 2a. The modified image pattern members 110d and 110e may then be bombarded with ions in block 114, as illustrated in FIG. 2b, to create ion-implanted sections 114e, 114f, and 114g, and then the image pattern members 110d and 110e may then be stripped from the substrate 102a in block 116, as illustrated in FIG. 2c, in substantially the same manner as described above. In an embodiment, the oxidant in the fluid may include $H_2O_2$, $HNO_3$, or $O_3$. In experimental embodiments, it has been found that allowing the treating material having a relatively low carbon ratio relative to the image photoresist to chemically bond to the surface of the image pattern reduces the carbonizing phenomenon (e.g., the carbon 'crust') that occurs on the surface of the image pattern in response to ion bombardment, such that a wet etch/strip process that will not damage the ion-implanted sections on the substrate may be used to remove the image pattern without leaving any material (e.g., the carbon 'crust') on the substrate that could cause defects in the semiconductor device being manufactured.

The foregoing has outlined features of several embodiments. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method for manufacturing a semiconductor device, comprising:
    coating a photoresist layer on a substrate;
    exposing the photoresist layer to radiation;
    after exposing the photoresist layer, developing the photoresist layer to create a pattern including a photoresist feature; and
    treating the photoresist feature with a treating material to form a treated photoresist feature, wherein the treating includes diffusing the treating material into the photoresist feature thereby modifying a composition of the photoresist feature;
    wherein a carbon atom ratio of the treating material is less than a carbon atom ratio of the photoresist, and wherein the treating material includes at least one of a first material having a C—O backbone or a second material having a Si—O backbone.

2. The method of claim 1, wherein the treating material comprises the first material having the C—O backbone with the formula:

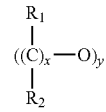

wherein the molecular weight of the treating material is between 500 and 20,000, x is between 1 and 6, and y is between 20 and 100.

3. The method of claim 2, wherein x is selected from the group consisting of 1, 2, and 3, and y is between 20 and 60.

4. The method of claim 2, wherein $R_1$ and $R_2$ are selected from the group consisting of hydrogen, a hydroxyl group, a fluorine atom, an alkyl group, and an alkoxyl group.

5. The method of claim 2, wherein $R_1$ and $R_2$ are selected from the group consisting of an amine, an amido, an aminol, an epoxy, a SiO, an alcohol, a halogen, a thio, an ester, and a carboxylic group.

6. The method of claim 1, wherein the treating material comprises the second material having the Si—O backbone with the formula:

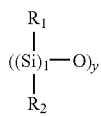

wherein the molecular weight of the treating material is between 500 and 20,000, and y is between 10 and 100.

7. The method of claim 6, wherein y is between 20 and 40.

8. The method of claim 6, wherein $R_1$ and $R_2$ are selected from the group consisting of hydrogen, a hydroxyl group, a fluorine atom, an alkyl group, and an alkoxyl group.

9. The method of claim 6, wherein $R_1$ and $R_2$ are selected from the group consisting of an amine, an amido, an aminol, an epoxy, a SiO, an alcohol, a halogen, a thio, an ester, and a carboxylic group.

10. A method for manufacturing a semiconductor device, comprising:
    forming a layer of photoresist on a substrate;
    patterning the photoresist to form an image pattern including a photoresist feature; and
    treating the photoresist feature, wherein the treating includes diffusing a treating material into the photoresist feature such that at least a portion of the photoresist feature has a higher non-carbon atom ratio than the layer of photoresist before the treating; and
    heating the treated photoresist feature, wherein the heating drives the treating material to a non-surface region of the photoresist features.

11. The method of claim 10, further comprising: stripping the image pattern from the substrate, wherein the stripping comprises wet stripping using a fluid solvent comprising at least one of NMP, PGME, PGMEA, and DMSO.

12. The method of claim 10, further comprising: stripping the image pattern from the substrate, wherein the stripping comprises wet stripping using a plasma comprising at least one of $O_2$, $H_2$, $CF_4$, $Cl_2$, and HBr.

13. The method of claim 10, wherein the treating material is selected from the group consisting of:
    a treating material comprising C—C backbone with the formula:

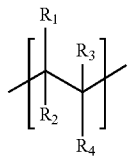

a treating material comprising C—O backbone with the formula:

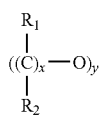

wherein x is between 1 and 6, and y is between 20 and 100; and a treating material comprising Si—O backbone with the formula:

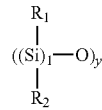

wherein y is between 10 and 100.

14. A method for manufacturing a semiconductor device, comprising:
    forming a photosensitive layer on a substrate;
    patterning the photosensitive layer to form an image pattern of photosensitive material; and
    treating the image pattern of photosensitive, wherein the treating comprises treating the image pattern with a material selected from the group consisting of:
    a treating material comprising C—O backbone with the formula:

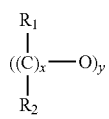

wherein x is between 1 and 6, and y is between 20 and 100;

a treating material comprising Si—O backbone with the formula:

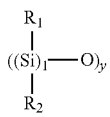

wherein y is between 10 and 100; and combinations thereof.

15. The method of claim 14, wherein responsive to the treating, bonding the treating material to a surface of the image pattern.

16. The method of claim 14, wherein the treating includes incorporating the treating material into the photoresist material of the image pattern, modifying the composition of the image pattern.

17. The method of claim 1, wherein the treated photoresist feature having a modified composition has a greater non-carbon atom ratio than the photoresist feature prior to the treating.

* * * * *